(12) United States Patent
Kerr et al.

(10) Patent No.: US 6,565,694 B2
(45) Date of Patent: May 20, 2003

(54) METHOD OF PREPARING METAL PLATES TO ALLOW LAMINATION OF A PRE-PRESS COLOR PROOF

(75) Inventors: Roger S. Kerr, Brockport, NY (US); David A. Niemeyer, Rochester, NY (US); Larry R. Gartz, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/912,159

(22) Filed: Jul. 24, 2001

(65) Prior Publication Data

US 2003/0019569 A1 Jan. 30, 2003

(51) Int. Cl.[7] .................. B44C 1/165; B32B 31/00; B32B 31/20; B41M 3/12; B41J 2/01
(52) U.S. Cl. .................. 156/230; 156/233; 156/235; 156/240; 156/247; 156/277; 156/289; 427/148; 428/42.1; 428/195; 428/202; 428/344; 428/914; 347/105
(58) Field of Search .................. 156/230, 231, 156/233, 234, 235, 237, 239, 240, 241, 247, 277, 289; 428/40.1, 41.1, 41.5, 41.6, 41.8, 42.1, 195, 200, 202, 343, 344, 347, 914; 503/227; 427/146, 147, 148; 347/101, 103, 105; 101/407.1; 400/118.2

(56) References Cited

U.S. PATENT DOCUMENTS

| 5,203,942 A | 4/1993 | DeCook et al. |
| 5,268,708 A | 12/1993 | Harshbarger et al. |
| 5,278,576 A | * 1/1994 | Kaszczuk et al. ............. 346/1.1 |
| 5,342,821 A | * 8/1994 | Pearce ......................... 503/227 |
| 5,478,434 A | 12/1995 | Kerr et al. |
| 6,022,440 A | * 2/2000 | Nordeen et al. ............. 156/241 |

FOREIGN PATENT DOCUMENTS

| GB | 2354737 A | * 4/2001 | ............. B41J/19/20 |

OTHER PUBLICATIONS

Lewis, Sr., R, "Hawley's Condensed Chemical Dictionary", 12th Edition. VNR, New York, NY, 1993, pp. 678, 940, and 1211.*

Kerr, "Laminator Assembly Having a Pressure Roller with a Deformable Layer", USSN 09/676,877, (Attorney Docket No. 78274), filed Sep. 29, 2000.

* cited by examiner

Primary Examiner—J. A. Lorengo
(74) Attorney, Agent, or Firm—Nelson Adrian Blish

(57) ABSTRACT

Laminating a pre-press proof (200) onto a coated metal plate (340), consisting of the steps of: laminating a pre-laminate sheet (240) to a coated metal plate (340). Removing the first support layer (150) forming a pre-laminated receiver stock (230). Creating an imaged receiver sheet (140) laminating the imaged receiver sheet (140) to the pre-laminated receiver stock (230) thereby encapsulating the representative image (290) and removing the second support layer (170) forming a pre-press proof (200) onto a coated metal plate (340).

7 Claims, 4 Drawing Sheets

METHOD OF PREPARING METAL PLATES TO ALLOW LAMINATION OF A PRE-PRESS COLOR PROOF

CROSS REFERENCE TO RELATED APPLICATIONS

Reference is made to commonly-assigned copending U.S. patent application Ser. No. 09/911,744, filed Jul. 24, 2001, entitled METHOD OF PREPARING PLASTIC MATERIALS TO ALLOW LAMINATION OF A PRE-PRESS COLOR PROOF, by Roger S. Kerr et al., the disclosure of which is incorporated herein.

FIELD OF THE INVENTION

The present invention relates to the art of color proofing, and in particular, to a method of preparing metal plates to accept an image to create a pre-press proof on the metal plates, such as by the use of pressure and heat to laminate media together.

BACKGROUND OF THE INVENTION

Pre-press proofing is a procedure that is used primarily by the printing industry for creating representative images of printed material. In the printing industry pre-press color proofs are used to check for color balance, control parameters, and other important image quality requirements, without the cost and time that is required to actually produce printing plates, set up a printing press, and produce an example of a representative image, which would result in higher costs and a loss of profits that would ultimately be passed on to the customer.

To create a pre-press proof first an original image is separated into individual color separations or digital files. The original image is scanned and separated into the three subtractive primaries and black. Typically a color scanner is used to create the color separations or digital files and in some instances, more than four color separations or digital files are used. Although there are several ways used in the printing industry to create a pre-press proof from the color separations or digital files they are generally one of three types. The first method being a color overlay system that employs the representative image on a separate base for each color, which are then overlaid to create a pre-press proof. The second, a single integral sheet process in which the separate colors for the representative image is transferred one at a time by lamination onto a single base. Third, a digital method in which the representative image is produced directly onto a receiver stock, or onto an intermediate sheet then transferred by lamination onto a receiver stock from digital files.

The representative image to be laminated can be created on, but is not limited to, a commercially available Kodak image processing apparatus, depicted in commonly assigned U.S. Pat. No. 5,268,708, which describes an image processing apparatus having half-tone color imaging capabilities. The above-mentioned image processing apparatus is arranged to form a representative image onto a sheet of thermal print media in which colorant from a sheet of colorant donor material is transferred to the thermal print media, by applying a sufficient amount of thermal energy to the colorant donor sheet material to form the representative image. The image processing apparatus is comprised generally of a material supply assembly and a lathe bed scanning subsystem. The scanning subsystem includes: a lathe bed scanning frame, translation drive, translation stage member, printhead, imaging drum, and media exit transports.

The operation of the image processing apparatus comprises metering a length of the thermal print media (in roll form) from the material supply assembly. The thermal print media is then measured and cut into sheet form of the required length and transported to the imaging drum, registered, wrapped around, and secured onto the imaging drum. Next, a length of colorant donor material (in roll form) is also metered out of the material supply assembly, then measured and cut into sheet form of the required length. It is then transported to the imaging drum; wrapped around the imaging drum; and superposed in the desired registration with respect to the thermal print media (which has already been secured to the imaging drum).

After the colorant donor sheet material is secured to the periphery of the imaging drum the scanning subsystem or write engine provides the imaging function. This image function is accomplished by retaining the thermal print media and the colorant donor sheet material on the imaging drum while it is rotated past the printhead. The translation drive traverses the printhead and translation stage member axially along the axis of the imaging drum, in coordinated motion with the rotating imaging drum. These movements combine to produce the representative image on the thermal print media.

Once the representative image has been formed on the thermal print media, the colorant donor sheet material is then removed from the imaging drum. This is accomplished without disturbing the thermal print media that is beneath it. The colorant donor sheet material is then transported out of the image processing apparatus by means of the material exit transport. Additional colorant donor sheet materials featuring other desired colorants are sequentially superimposed with the thermal print media on the imaging drum and then imaged onto the thermal print media as previously mentioned, until the representative image is completed on the thermal print media. The representative image formed thereon is then unloaded from the imaging drum and transported by the receiver sheet material exit transport to an exit tray in the exterior of the image processing apparatus.

After a representative image has been formed on the thermal print media as previously described it is transferred to a receiver stock such that the pre-press proof is representative of the image that will be printed by the printing press. A Kodak laminator as described in U.S. Pat. No. 5,478,434 can be used to bond or laminate the representative image as a part of a pre-press proofing system. As additional references U.S. Pat. No. 5,203,942 describes a Kodak laminator that employs a lamination/de-lamination system as applied to a drum laminator and pending U.S. patent application Ser. No. 09/676,877, filed Sep. 29, 2000, describes a Kodak laminator that employs endless belts incorporated into the lamination apparatus. For the purpose of this patent application the laminator described in U.S. patent application Ser. No. 09/676,877 will be used. It should be noted that the present invention described in this disclosure is not limited to a Kodak laminator or type of laminator referenced above.

The receiver stock can be sheet-fed press printing stock, specially coated paper stock, or previously laminated stock. In this latter case a sheet of pre-laminate, which has a pre-laminate support layer consisting of a suitable base material, optionally coated with a releasing material, and a thermal print layer, is placed on top of a receiver sheet, which is also called receiver stock in the industry. This construction of multiple layers is a lamination sandwich, which is fed into the laminator. Once the lamination sandwich exits the laminator the pre-laminate support layer is peeled away from the now pre-laminated receiver stock. Any of the laminators referred to above can be used to affect the transfer of the pre-laminate receiving layer to the receiver stock.

The above described lamination method works well for most materials and both laser thermal and inkjet pre-press proofs. There exists a need for laminating to a wide variety of metal plates some of which the thermal print media will not laminate to.

SUMMARY OF THE INVENTION

The present invention provides a method of preparing metal plates to accept an image to create a pre-press proof on the metal plates. The novel methods are preferably for forming a pre-press proof, but not limited to, with a resolution of between about 1000 and about 4000 dpi and most preferably having a resolution of about 1800 to 3000 dpi.

Specifically the methods involve the preparation of metal plates by means of coating with a lacquer, varnish or a chlorinated polypropylene thereby allowing the lamination of a pre-press proof. Using treated metal plates to create a pre-press proof comprises the steps of: laminating a pre-laminate sheet consisting of a first thermoplastic layer, and first support layer having a support base and release layer to the treated metal plates then removing the first support layer forming a pre-laminated receiver stock. Creating an imaged receiver sheet consisting of a representative image formed on a thermoplastic layer and a support layer having a support base, aluminized layer and release layer then laminating the imaged receiver sheet to the pre-laminated receiver stock and removing the second support layer thereby forming a pre-press proof.

The method of preparing metal plates by means of, coating said metal plate with a lacquer, varnish or a chlorinated polypropylene, thereby allowing the lamination of a pre-press proof. Using treated metal plates to create a pre-press proof comprises the steps of: creating an imaged receiver sheet consisting of a representative image formed on a thermoplastic layer and a support layer having a support base, aluminized layer and release layer then laminating the imaged receiver sheet to the chlorinated polypropylene treated metal plates and removing the support layer thereby forming a pre-press proof.

The above, mentioned treatments could be accomplished on an as needed basis manually or automated such as in a printing press. Metal plates to be printed on in a printing press are generally treated to allow ink to be printed on them.

DETAILED DESCRIPTION OF THE INVENTION

The present invention will be directed, in particular, to elements forming part of, or cooperating more directly with an apparatus in accordance with the present invention. It is to be understood that elements not specifically shown or described may take various forms well known to those skilled in the art. For the sake of discussion, but not limitation, the preferred embodiment of the present invention will be illustrated in relation to a laminating apparatus for making pre-press proofs.

Figure 1:
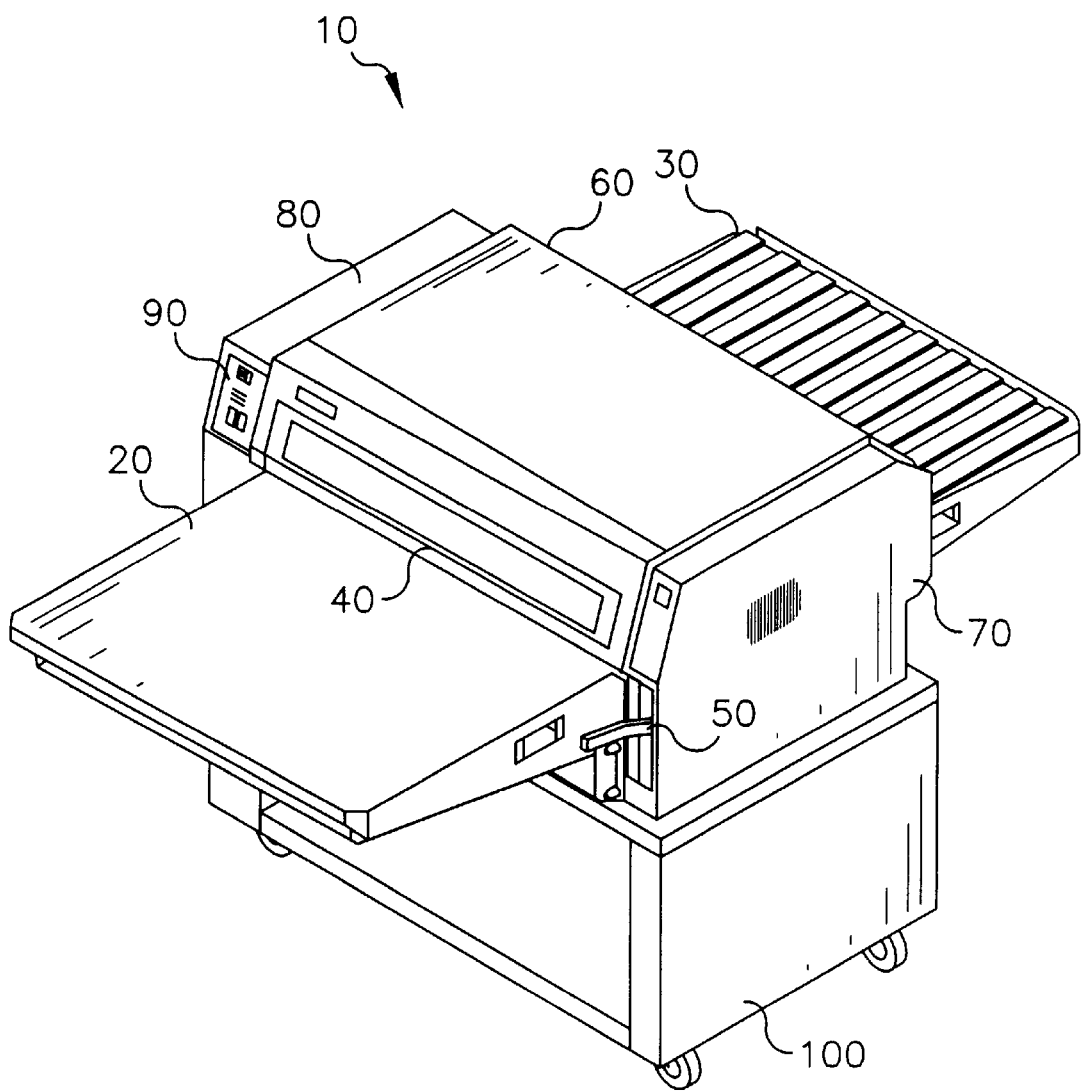
FIG. 1 is a perspective view showing a laminator known in the related art used with the present invention.

Referring to the drawings wherein like reference numerals represent identical or corresponding parts throughout the several views. Referring to FIG. 1, there is shown perspective view of laminator 10 as described in U.S. patent application Ser. No. 09/676,877. The laminator has an entrance table 20, exit table 30, entrance slot 40, pressure lever 50, top cover 60, right side cover 70, left side cover 80, control panel 90, and lamination base 100.

Figure 2:
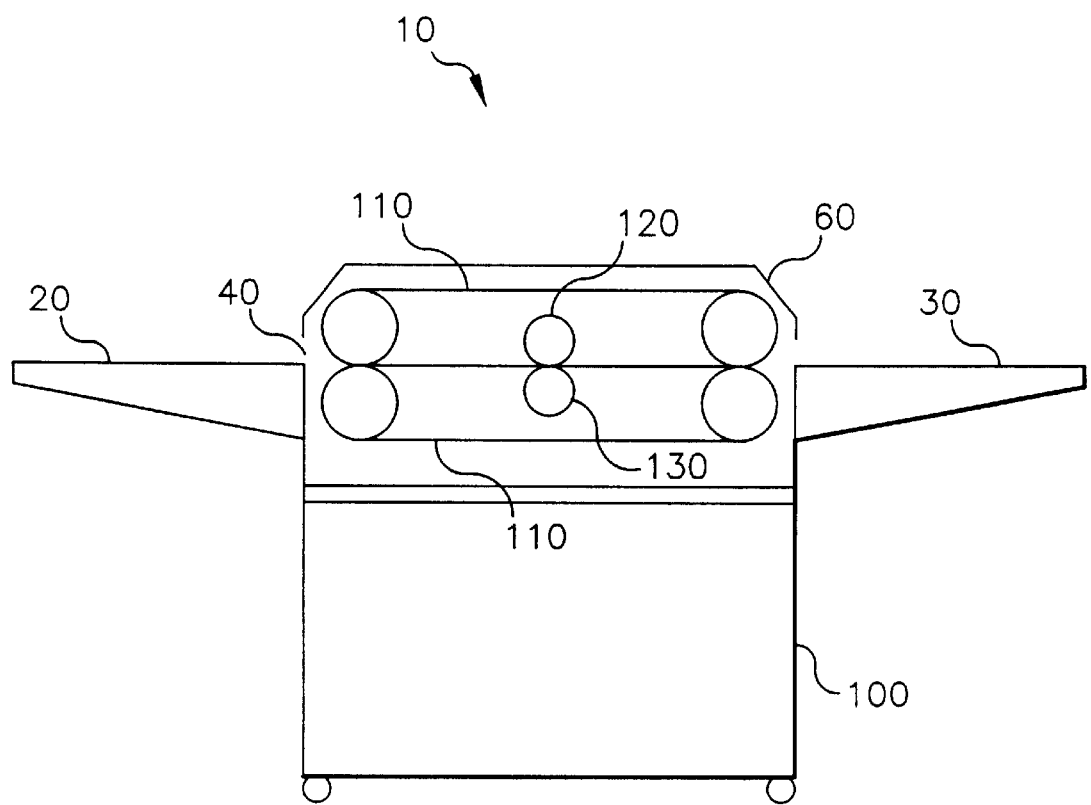
FIG. 2 is a schematic right side elevation of the laminator of FIG. 1.

FIG. 2 is a schematic right side elevation of the laminator of FIG. 1 showing endless belts 110 with upper lamination roller 120 and lower lamination roller 130 which convey the media to be laminated through the laminator 10. Media to be bonded or laminated passes between the endless belts 110. Upper lamination roller 120 and lower lamination roller 130 provide heat and pressure to laminate the desired media together. This configuration with upper lamination roller 120 and lower lamination roller 130 is called a "straight-through" laminator. Although the illustrated embodiments show both the upper lamination roller 120 and lower lamination roller 130 as heated pressure rollers, it also should be recognized that only one of the upper lamination roller 120 and lower lamination roller 130 may be heated. It is further recognized that both upper lamination roller 120 and lower lamination roller 130 do not have to be heated for cold lamination applications.

The following methods are usable for forming a pre-press proof 200 with a resolution of between about 1000 and 4000 dpi, although in the most preferred embodiment, the high resolution is between 1800 and 3000 dpi.

Generally laminating a pre-press proof 200 of this type is a two-pass process the present invention contemplates a single pass construction as well. The image can be initially created on thermal print media with an inkjet printer, laser printer, or any other printing method known in the art.

Figure 3:
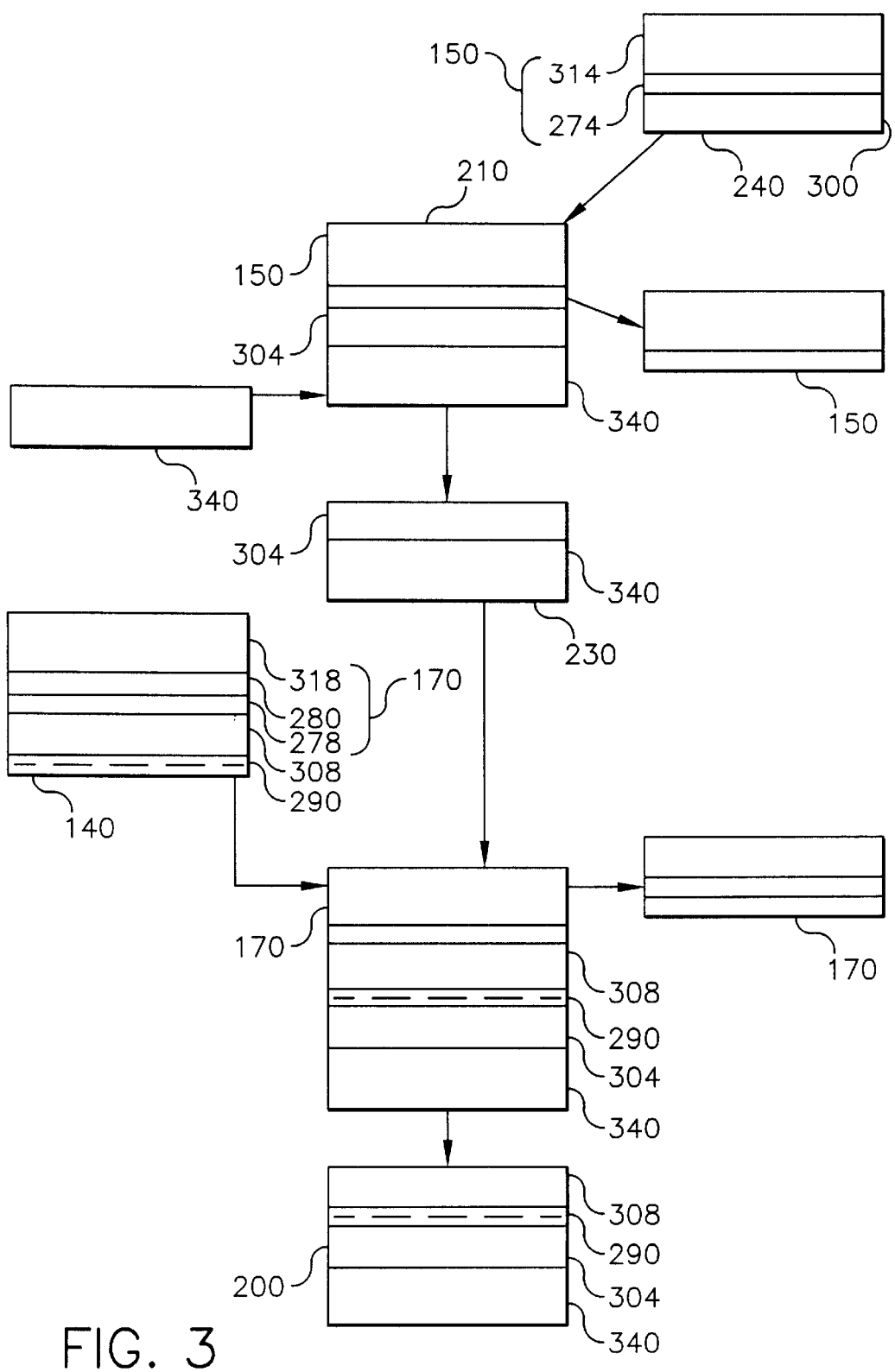
FIG. 3 is a block diagram showing one embodiment of the method for producing a pre-press proof of the present invention.

Referring to FIG. 3 a block diagram is shown outlining a method for laminating a pre-press proof 200 onto a metal plate 340, coated with a varnish, lacquer, chlorinated polypropylene or other material well known in the art comprises the steps of: laminating a pre-laminate sheet 240 consisting of a first thermoplastic layer 304, and first support layer 150 having a first support base 314 and a first release layer 274. It should be noted that first support layer 150 may be comprised of several layers or a single support base 310 to a coated metal plate 340. Removing the first support layer 150 forming a pre-laminated receiver stock 230. Creating an imaged receiver sheet 140 consisting of a representative image 290 formed on a second thermoplastic layer 308 and a second support layer 170 having a second support base 318, aluminized layer 280 and second release layer 278. It should be noted that second support layer 170 may be comprised of several layers or a single support base 310. Laminating the imaged receiver sheet 140 to the pre-laminated receiver stock 230 thereby encapsulating the representative image 290 between the first thermoplastic layer 304 and second thermoplastic layer 308 and removing the second support layer 170 forming a pre-press proof 200 onto a coated metal plate 340.

Figure 4:
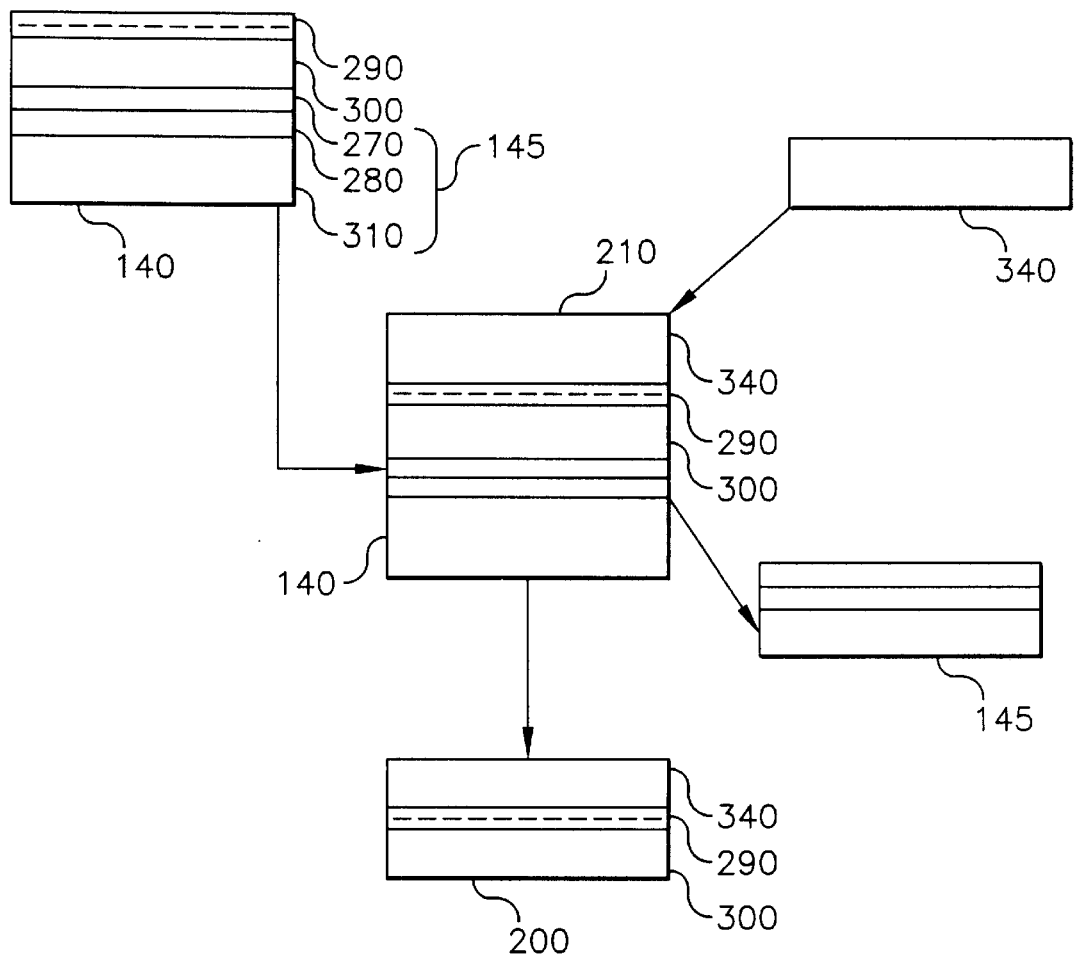
FIG. 4 is a block diagram showing a second embodiment of the method for producing a pre-press proof.

Referring to FIG. 4 a block diagram is shown outlining another embodiment of the invention. A method for laminating a pre-press proof 200 onto a coated metal plate 340 coated with a varnish, lacquer, chlorinated polypropylene or other materials well known in the art comprises the steps of:

laminating a coated metal plate 340 to an imaged receiver sheet 140 consisting of a representative image 290 formed on a thermoplastic layer 300 and a support layer 145 having a support base 310, aluminized layer 280 and release layer 270. It should be noted that support layer 145 may be comprised of several layers or a single support base 310 thereby encapsulating the representative image 290 between the thermoplastic layer 300 and the coated metal plate 340 and removing support layer 145 forming a pre-press proof 200 onto a coated metal plate 340.

The invention has been described in detail with particular reference to certain preferred embodiments thereof, but it will be understood that variations and modifications can be effected within the scope of the invention.

Parts List

10. Laminator
20. Entrance table
30. Exit table
40. Entrance slot
50. Pressure lever
60. Top cover
70. Right side cover
80. Left side cover
90 Control panel
100. Lamination base
110. Endless belts
120. Upper lamination roller
130. Lower lamination roller
140. Imaged receiver sheet
145. Support layer
150. First support layer
170. Second support layer
200. Pre-press proof
210. Lamination sandwich
230. Pre-laminated receiver stock
240. Pre-laminate sheet
270. Release layer
274. First release layer
278. Second release layer
280. Aluminized layer
290. Representative image
300. Thermoplastic layer
304. First thermoplastic layer
308. Second thermoplastic layer
310. Support base
314. First support base
318. Second support base
340. Coated metal plate

What is claimed is:

1. A method for laminating a pre-press proof comprising:
   coating a metal plate with a member of the group comprising lacquer, varnish, and chlorinated polypropylene forming a coated metal plate;
   laminating a pre-laminate sheet of material comprising a first thermoplastic layer and first support layer, to said coated metal plate;
   removing said first support layer thereby forming a pre-laminated receiver stock;
   creating an imaged receiver sheet with a second support layer; consisting of a support base, release layer, and an aluminized layer;
   laminating said imaged receiver sheet with said pre-laminated receiver stock; and
   removing said second support layer thereby forming a pre-press proof with a resolution between 1800 dpi and 4000 dpi.

2. The method of claim 1 wherein said first support layer is comprised of a support base and release layer.

3. The method of claim 1 wherein said imaged receiver sheet comprises a monochrome image.

4. The method of claim 1 wherein said imaged receiver sheet comprises a multi colored image.

5. The method of claim 1 wherein said first thermoplastic layer has a thickness between 1 and 75 microns.

6. The method of claim 1 wherein said imaged receiver sheet comprises an inkjet generated image.

7. The method of claim 1 wherein said metal plate is coated in a printing press.

* * * * *